US006555448B2

(12) United States Patent
Fukushima

(10) Patent No.: US 6,555,448 B2
(45) Date of Patent: Apr. 29, 2003

(54) SEMICONDUCTOR MANUFACTURING METHOD

(75) Inventor: Yasumori Fukushima, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/847,313

(22) Filed: May 3, 2001

(65) Prior Publication Data

US 2001/0041397 A1 Nov. 15, 2001

(30) Foreign Application Priority Data

May 11, 2000 (JP) ........................................ 2000-138141

(51) Int. Cl.⁷ ........................ H01L 21/322; H01L 21/00
(52) U.S. Cl. ........................ 438/471; 438/162; 438/166
(58) Field of Search ............................. 438/471, 143, 438/162, 164, 149, 166, 473, 476

(56) References Cited

U.S. PATENT DOCUMENTS

| 6,066,518 | A | 5/2000 | Yamazaki ................ 438/166 |
| 6,133,119 | A | 10/2000 | Yamazaki | |
| 6,153,445 | A | 11/2000 | Yamazaki et al. .......... 438/158 |
| 6,162,704 | A | 12/2000 | Yamazaki et al. | |
| 6,165,824 | A | 12/2000 | Takano et al. ............ 438/160 |
| 6,197,626 | B1 | 3/2001 | Yamazaki et al. | |
| 6,420,246 | B1 * | 7/2002 | Yamazaki et al. ......... 438/476 |
| 6,436,745 | B1 | 8/2002 | Gotou et al. | |

FOREIGN PATENT DOCUMENTS

| JP | 6-244103 | 9/1994 | |
| JP | 10-223533 | 8/1998 | |
| JP | 11354447 A | 12/1999 | ........... H01L/21/20 |

* cited by examiner

Primary Examiner—Olik Chaudhuri
Assistant Examiner—Brook Kebede
(74) Attorney, Agent, or Firm—Nixon & Vanderhye P.C.

(57) ABSTRACT

There is provided a semiconductor manufacturing method capable of sufficiently reducing catalytic element in a crystalline silicon film and also increasing the area of the crystalline silicon film to be left on the substrate. A catalytic element for accelerating the crystallization is introduced into an amorphous silicon film on a substrate, and a first heat treatment is performed to crystallize the amorphous silicon film into a crystalline silicon film. A mask layer is provided on the surface of the crystalline silicon film, the mask layer having an opening passing thicknesswise through the mask layer. Further thereon, a sacrifice film is formed so as to continuously cover the surface of the mask layer and an opening-correspondent portion of the crystalline silicon film. A getter element for gettering the catalytic element is introduced into the sacrifice film and the opening-correspondent portion of the crystalline silicon film. A second heat treatment is performed, by which the catalytic element is gettered from the crystalline silicon film to the sacrifice film through the opening.

10 Claims, 3 Drawing Sheets

SEMICONDUCTOR MANUFACTURING METHOD

BACKGROUND OF THE INVENTION

The present invention relates to a semiconductor manufacturing method and, more specifically, to a method for manufacturing a silicon semiconductor thin film having crystallinity. Silicon semiconductor thin films fabricated according to the semiconductor manufacturing method of the invention are suitably used as the material of TFTs (Thin Film Transistors) in active-matrix type LCDs (Liquid Crystal Displays) and various kinds of semiconductor devices.

Although amorphous silicon is generally used as the material of TFTs, yet its electrical characteristics are much inferior to lower than those of single-crystalline semiconductors used in so-called silicon LSIs or the like. Therefore, in LCDs, TFTs are used exclusively as switching devices only, and not used for peripheral circuits to which high performance is demanded. Also, studies have been made on using polysilicon in place of amorphous silicon to improve the characteristics of TFTs. However, polysilicon has limitations in electrical characteristics, not meeting the demand.

Recently, there has been proposed a method for obtaining a silicon film, including the steps of introducing a metallic element, such as nickel, as a catalyst for accelerating the crystallization on the surface portion of the amorphous silicon film so as to cause a reaction between the surface portion of the amorphous silicon film and the metallic element, thereafter removing the reactant, and annealing the remaining silicon film to advance the crystallization, thereby obtaining a silicon film superior in crystallinity (which is referred to as CGS or continuous grain silicon film in some cases, but herein referred to as "crystalline silicon film") (Japanese Patent Laid-Open Publication HEI 6-244103).

However, it cannot be neglected that the catalytic element remaining in the crystalline silicon film may have adverse effects on the electrical characteristics and reliability of the TFTs such as shifts of their threshold voltage and deterioration in hot carrier resistance.

Therefore, there have been developed a method of removing the catalytic element remaining in the crystalline silicon film (Japanese Patent Laid-Open Publication HEI 10-223533). That is, as shown in FIG. 2, for example, phosphorus (P) is ion-implanted as an element (referred to as "getter element") for gettering the catalytic element at a partial region 3 of a crystalline silicon film 2 formed on a substrate 1, and heat treatment of a specified temperature is performed, by which the catalytic element remaining in the crystalline silicon film 2 is absorbed up to the region 3 (gettering). Subsequently, the region (which is referred to as gettering region) 3 is removed by etching or the like so that a crystalline silicon film 2 of low catalytic-element concentration is left on the substrate 1. TFTs using this crystalline silicon film 2 show excellent electrical characteristics in terms of mobility, subthreshold and the like, compared with those using polysilicon.

Whereas silicon LSIs generally have an impurity concentration of the channel region in the transistor at a level of about $1 \times 10^{12}$ cm$^{-2}$, it is known that mixing of metal impurities of higher than the level of about $1 \times 10^{11}$ cm$^{-2}$ would have adverse effects on the transistor characteristics. On the ground that the substrate surface concentration of the metallic element is set normally to $1 \times 10^{12} - 1 \times 10^{13}$ cm$^{-2}$ for growth of a crystalline silicon film, it can be considered that the concentration needs to be made below about $1 \times 10^{10}$ cm$^{-2}$ by lowering the catalytic-element concentration in a gettered region (region other than the gettering region 3 in the crystalline silicon film 2) 4 to $\frac{1}{100} - \frac{1}{1000}$ in the gettering process.

The getterability can be considered roughly as dependent on (1) area ratio between gettering region 3 and gettered region 4, (2) getter element concentration in the gettering region 3, and (3) temperature and time of heat treatment in the gettering process. Among these factors, with regard to (1), the larger the area of the gettering region 3 relative to the area of the gettered region 4 becomes, the more the getterability improves while, unfortunately, the region where TFTs can be formed is limited proportionally. With regard to (2), whereas increasing the getter element concentration leads to increase in getterability, it has been empirically verified that the getterability, after reaching above a certain level of concentration (about $8 \times 10^{15}$ cm$^{-2}$), would not improve any more. With regard to (3), whereas increasing the heat treatment temperature allows the gettering to be achieved in shorter time, the total amount of getterable catalytic element can be considered unchanged. From these factors, in order to achieve sufficient gettering so that the characteristics and reliable of transistors are not adversely affected, an area ratio SR between gettering region 3 and gettered region 4, i.e.

SR=(area of gettering region 3)/(area of gettered region 4), needs to be ensured as a certain high level based on the factor (1).

Therefore, the conventional method has a problem that the area of the gettered region 4, i.e. the area of the crystalline silicon film 2 left on the substrate 1, becomes smaller, so that the layout in the arrangement of the TFTs is limited.

Therefore, an object of the present invention is to provide a semiconductor manufacturing method capable of sufficiently reducing the catalytic element in the crystalline silicon film and also increasing the area of the crystalline silicon film to be left on the substrate.

SUMMARY OF THE INVENTION

In order to achieve the above object, according to the present invention, there is provided a semiconductor manufacturing method comprising the steps of:

forming an amorphous silicon film on a substrate;

introducing into the amorphous silicon film a catalytic element for accelerating crystallization and performing a first heat treatment to crystallize the amorphous silicon film into a crystalline silicon film;

providing a mask layer having an opening extending therethrough thicknesswise on a surface of the crystalline silicon film;

forming a sacrifice layer which continuously covers the surface of the mask layer and a portion of the crystalline silicon film corresponding to the opening;

introducing to the sacrifice layer and the portion corresponding to the opening out of the crystalline silicon film a getter element for gettering the catalytic element; and performing a second heat treatment to getter the catalytic element from the crystalline silicon film to the sacrifice layer through the opening of the mask layer.

With the semiconductor manufacturing method of the invention, during the second heat treatment, the catalytic element present in a region (gettered region) other than the portion corresponding to the opening out of the crystalline silicon film (hereinafter, referred to as opening-correspondent portion) is gettered to the opening-correspondent portion of the crystalline silicon film. Further, the catalytic element is gettered from the opening-correspondent portion of the crystalline silicon film to the sacrifice layer through the opening of the mask layer. Thereafter, the sacrifice layer and the opening-correspondent portion of the crystalline silicon film are removed. As a result of this, a crystalline silicon film of low catalytic-element concentration (gettered region) is left on the substrate.

As can be seen, in the present invention, the whole sacrifice film in addition to the opening-correspondent portion of the crystalline silicon film acts as a gettering region that absorbs up the catalytic element. As a result of this, a volume ratio VR between gettering region and gettered region, i.e.

VR=(volume of gettering region)/(volume of gettered region), can be set to a large one. For example, when the thickness of the sacrifice film is set equal to the thickness of the crystalline silicon film, the volume ratio VR between gettering region and gettered region is necessarily beyond 1. Also, when the thickness of the sacrifice layer is set thicker than the thickness of the crystalline silicon film, the volume ratio VR between gettering region and gettered region can be set to an even larger one. Accordingly, the catalytic element in the gettered region can be reduced sufficiently. As a result of this, TFTs using this crystalline silicon film (gettered region) can be made excellent in electrical characteristics and reliability. Further, the area of the opening-correspondent portion of the crystalline silicon film can be reduced proportionally to the extent to which the getterability has improved over the prior art, so that the area of the crystalline silicon film (gettered region) left on the substrate can be enlarged. Accordingly, TFTs arrangement on the substrate is not limited in their layout.

In one embodiment, the mask layer comprises at least one of silicon oxide film, silicon nitride film and SiON film.

With this semiconductor manufacturing method of one embodiment, since the mask layer comprises at least one of silicon oxide film, silicon nitride film and SiON film, silicon can be used as the material of the sacrifice layer that covers the mask layer. Also, such a mask layer protects the ground crystalline silicon film (gettered region) during the removal of the sacrifice layer after the gettering process. Further, such a mask layer is easy to remove by selective etching with the crystalline silicon film left.

Also, in one embodiment, material of the sacrifice layer is any one of amorphous silicon, polysilicon and single crystal silicon.

With this semiconductor manufacturing method of one embodiment, the material of the sacrifice layer is any one of amorphous silicon, polysilicon and single crystal silicon, the sacrifice layer being formed principally from the silicon element as the crystalline silicon film is. By virtue of this homogeneity of material, the catalytic element can be gettered from the crystalline silicon film to the sacrifice film with high efficiency.

Also, in one embodiment, temperature of the second heat treatment is set to within a range of 500° C. to 700° C.

With this semiconductor manufacturing method of one embodiment, since the temperature of the second heat treatment is set to within a range of 500° C. to 700° C., the second heat treatment is performed at a relatively low temperature. Accordingly, deformation of the substrate and the like can be prevented. Further, the getter element is desirably one having a small diffusion coefficient, as compared with the catalytic element, at the temperature of the second heat treatment. This is because such a getter element does not diffuse into the mask layer but remains in the sacrifice layer during the second heat treatment, thus allowing the catalytic element to be gettered with high efficiency. In this semiconductor manufacturing method of one embodiment, since the temperature of the second heat treatment is set to within a range of 500° C.-700° C., it is easy to select such a getter element.

Also, in one embodiment, one kind of element or a plurality of kinds of elements selected from among Fe, Co, Ni, Cu, Ru, Rh, Pd, Os, Ir, Pt and Au is used as the catalytic element.

With this semiconductor manufacturing method of one embodiment, since one kind of element or a plurality of kinds of elements selected from among Fe, Co, Ni, Cu, Ru, Rh, Pd, Os, Ir, Pt and Au is used as the catalytic element, a high-quality crystalline silicon film can be obtained actually.

Also, in one embodiment, one kind of element or a plurality of kinds of elements selected from among nitrogen, phosphorus, arsenic, antimony and bismuth is used as the getter element.

With this semiconductor manufacturing method of one embodiment, one kind of element or a plurality of kinds of elements selected from among nitrogen, phosphorus, arsenic, antimony and bismuth is used as the getter element. These elements, having a property of bonding with metallic elements, allow the metallic element as a catalyst to be gettered with high efficiency. As a result of this, the catalytic-element concentration in the gettered region can be reduced sufficiently.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, a semiconductor manufacturing method of the present invention is described in detail by way of an embodiment thereof illustrated in the accompanying drawings.

Figure 1A:
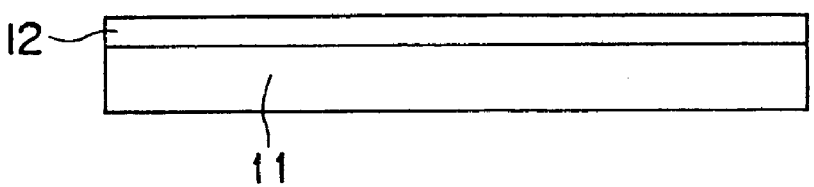
FIGS. 1A, 1B, 1C, 1D, 1E, 1F, 1G, 1H, 1I, 1J, 1K, 1L and 1M are sectional views showing processes in carrying out a semiconductor manufacturing method which is an embodiment of the invention.
Figure 1B:
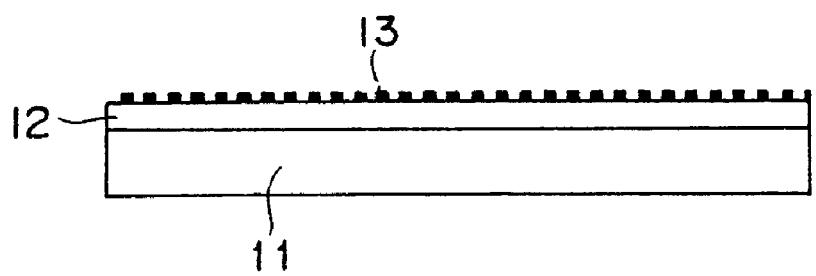
Figure 1C:
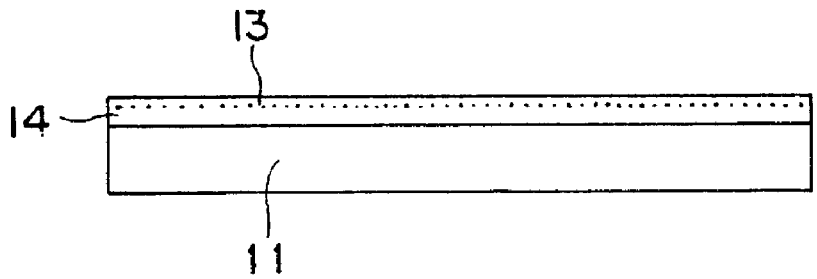
Figure 1D:
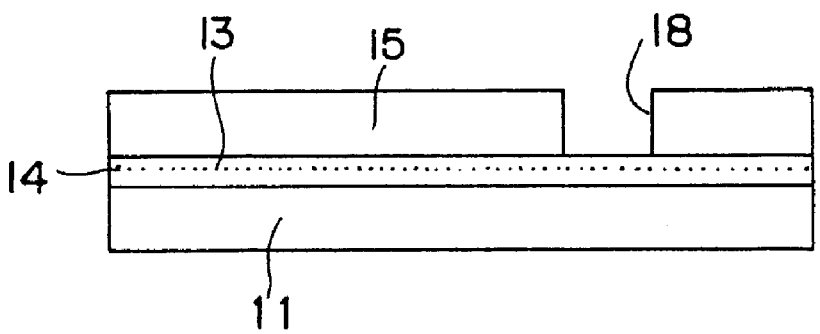
Figure 1E:
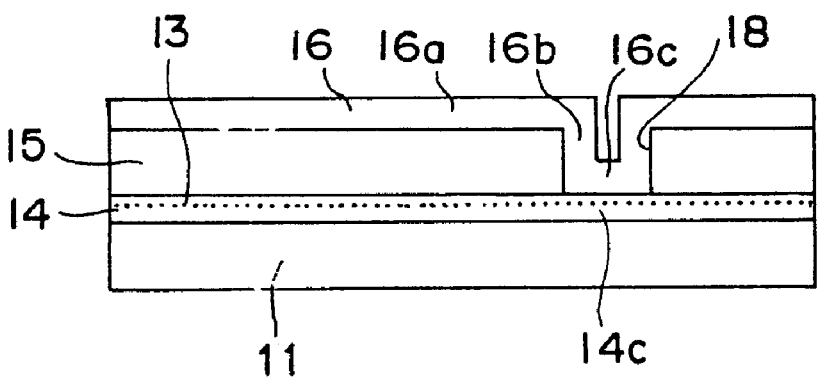
Figure 1F:
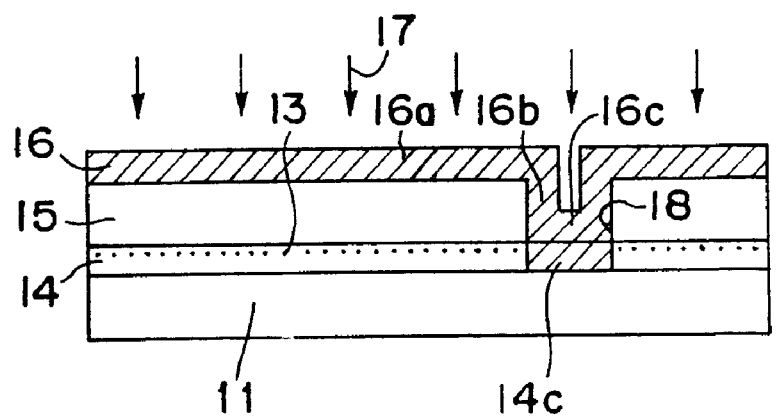
Figure 1G:
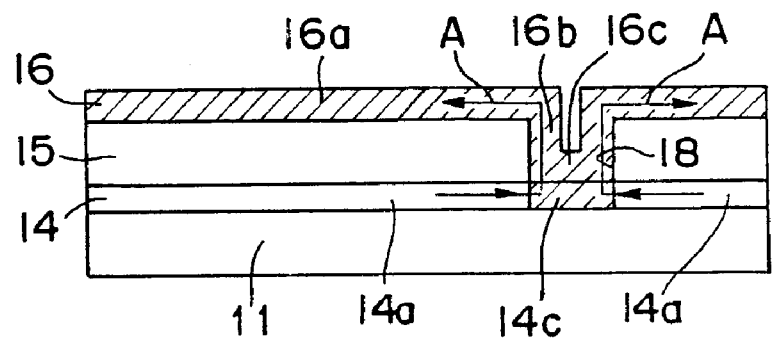

FIGS. 1A, 1B, 1C . . . 1M are sequentially show the steps of a TFT manufacturing method to which the present invention is applied.

i) As shown in FIG. 1A, an amorphous silicon ($\alpha$-Si) film 12 is deposited to a thickness of 70 nm on a quartz substrate 11 by LPCVD (low pressure chemical vapor deposition) process. Conditions for the growth are set to a temperature of 450° C. and a pressure of 50 pa with the use of disilane gas ($Si_2H_6$) as the material gas.

ii) Next, as shown in FIG. 1B, an aqueous solution prepared by dissolving a metallic element, for example, Ni to 10 ppm into pure water is applied over the entire surface of the α-Si film 12 by spinning process. This Ni element acts as a catalyst for accelerating the crystallization of the α-Si film 12 in a heat treatment process, which is described next. The concentration of the Ni 13 on the surface of the α-Si film 12 is set to $1\times10^{12}$–$1\times10^{13}$ cm$^{-2}$. It is also possible to use sputtering process, CVD process, plasma treatment process, vapor deposition process or the like as the method for adding the Ni 13 to the α-Si film 12.

iii) Next, a heat treatment (first heat treatment) at a temperature of 600° C. for 12 hours is performed in a nitrogen atmosphere, by which the α-Si film 12 is crystallized and thereby formed into a crystalline silicon film 14 as shown in FIG. 1C. This crystalline silicon film 14 is more successful in crystallinity, as compared with polysilicon.

iv) Next, as shown in FIG. 1D, a mask layer 15 is deposited on the crystalline silicon film 14 by CVD process or the like, and an opening 18 is formed so as to pass thicknesswise through the mask layer 15. This mask layer is formed of silicon oxide, silicon nitride or SiON film. The thickness of the mask layer 15 is set to, for example, about 200 nm so that ions of getter element are not implanted into the ground crystalline silicon film 14 in the later-described getter-element ion implantation process.

v) Next, as shown in FIG. 1E, a sacrifice film 16 formed of polysilicon is deposited to a thickness of 70 nm all over the substrate 11 by CVD process or the like. As a result, individual portions 16a, 16b, 16c of the sacrifice film 16 cover the top surface of the mask layer 15, the side surface within the opening 18, and an opening-correspondent portion 14c of the crystalline silicon film 14, respectively and continuously. It is noted that the sacrifice film 16 may be given by a material of silicon, whether amorphous silicon or single crystal silicon.

vi) Next, as shown in FIG. 1F, phosphorus (P) 17 having a property of bonding with the Ni element is ion-implanted as a getter element into the entire region of the sacrifice film 16 and the opening-correspondent portion 14c of the crystalline silicon film 14 (implantation region being shown by hatching in the figure). Conditions for the implantation are set to an acceleration energy of 10–80 keV and a dose of $1\times10^{15}$ cm$^{-2}$–$8\times10^{15}$ cm$^{-2}$. In this process, the mask layer 15 acts as a mask for the implanted ions, protecting the crystalline silicon film 14.

vii) Next, as shown in FIG. 1G, a heat treatment (second heat treatment) at a temperature of 600° C. for 24 hours is performed in a nitrogen atmosphere, by which the Ni element 13 is gettered into the entire sacrifice film 16 from the crystalline silicon film 14 through the opening 18 (the path of the Ni element 13 is shown by arrow A in the figure). More specifically, first, the opening-correspondent portion 14c of the crystalline silicon film 14 absorbs the Ni element 13 present in the other region (region to be gettered) 14a of the crystalline silicon film 14. Further, the Ni element 13 moves from the opening-correspondent portion 14c of the crystalline silicon film 14 to a bottom portion 16c of the sacrifice film 16 adjacent to the opening-correspondent portion 14c, and moreover moves the portion 16b covering the side surface of the mask layer 15 and the portion 16a covering the top surface of the mask layer 15.

As can be seen, the whole sacrifice film 16 in addition to the opening-correspondent portion 14c of the crystalline silicon film 14 acts as a gettering region that absorbs up the Ni element 13. As a result of this, a volume ratio VR between the gettering regions 14c, 16 and the gettered region 14a, i.e.

VR=(volume of gettering region)/(volume of gettered region), can be set to a large one. When the thickness of the sacrifice film 16 is set equal to the thickness (70 nm) of the crystalline silicon film 14 as in this example, the volume ratio VR between the gettering regions 14c, 16 and the gettered region 14a is necessarily beyond 1. Moreover, the material of the sacrifice film 16 is polysilicon as described above, the sacrifice film 16 being formed principally from silicon element as the crystalline silicon film 14 is. By virtue of this homogeneity of material, the Ni element 13 can be gettered from the crystalline silicon film 14 to the sacrifice film 16 with high efficiency. Further, at this heat treatment temperature of 600° C., the diffusion coefficient of the getter-element phosphorus 17 is small enough, compared with the diffusion coefficient of the Ni element 13. Therefore, the phosphorus 17 is not diffused into the mask layer 15 during this heat treatment, but remain in the sacrifice film 16, gettering the Ni element 13 efficiently. Thus, the Ni element 13 in the gettered region 14a can be reduced sufficiently.

As a result of this, TFTs using this crystalline silicon film 14 can be made excellent in electrical characteristics and reliability. Further, proportionally to the extent to which the getterability has improved over the prior art, the area of the opening-correspondent portion 14c of the crystalline silicon film 14 can be reduced, and the area of the crystalline silicon film 14 (gettered region 14a) left on the substrate 11 can be enlarged. Accordingly, TFTs arrangement on the substrate 11 is not limited in their layout.

In addition, when the thickness of the sacrifice film 16 is set thicker than the thickness of the crystalline silicon film 14, the volume ratio VR between the gettering regions 14c, 16 and the gettered region 14a can be set even larger, so that the Ni element 13 in the gettered region 14a can be further reduced.

Figure 1H:
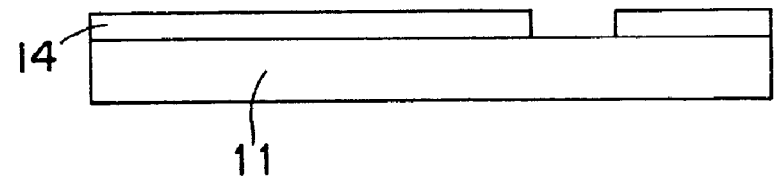
Figure 1I:
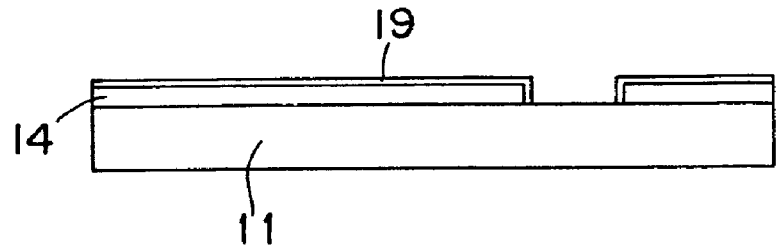
Figure 1J:
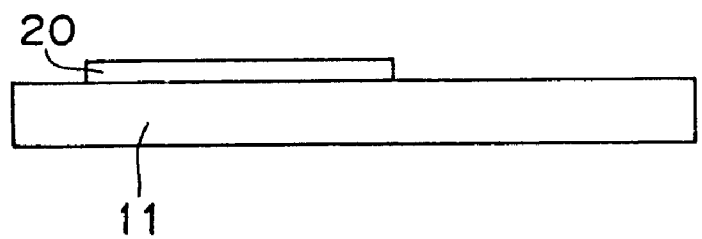
Figure 1K:
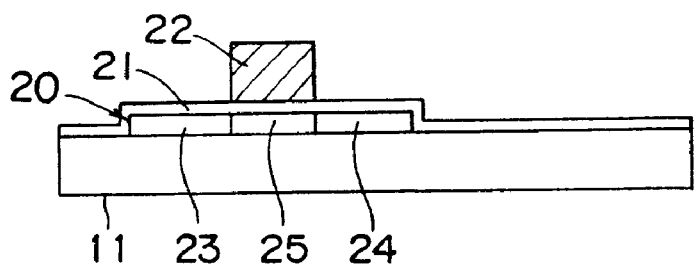
Figure 1L:
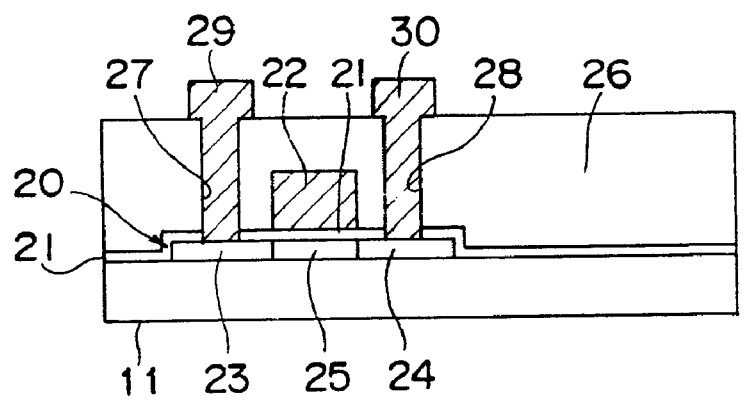
Figure 1M:
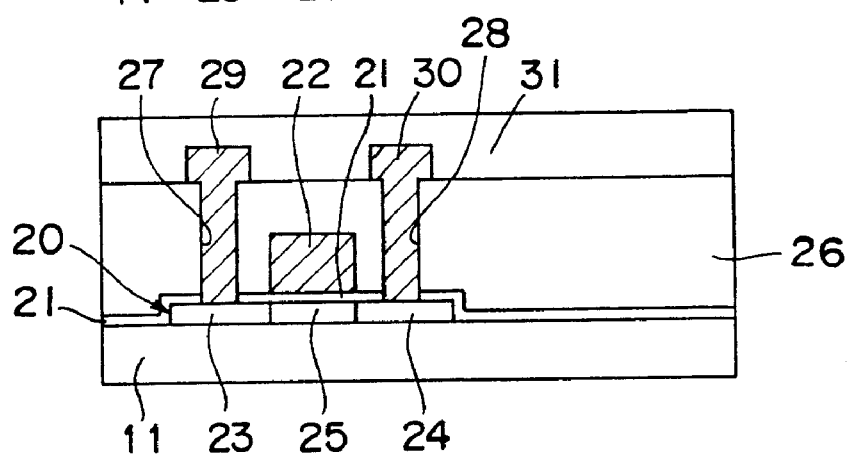
Figure 2:
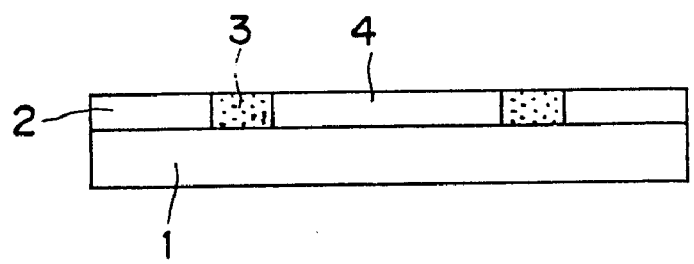
FIG. 2 is a view for explaining the gettering process according to the prior art.

Also, since this heat treatment is performed at a relatively low temperature of 600° C., deformation of the substrate 11 and the like can be prevented.

viii) Next, as shown in FIG. 1H, the sacrifice film 16 is removed by etching, and with the mask layer 15 used as a mask, the opening-correspondent portion 14c of is the crystalline silicon film 14 is removed by etching. In this process, the mask layer 15 acts as an etching stopper to protect the ground crystalline silicon film (gettered region) 14. Thereafter, the mask layer 15 is removed by etching it selectively against the crystalline silicon film 14. This mask layer 15 is composed of silicon oxide, silicon nitride or SiON film as described above, and therefore easy to etch selectively with the crystalline silicon film 14 left.

ix) Next, as shown in FIG. 1I, oxidation is performed at a temperature of 900° C.—1050° C. for a specified time in an oxidizing atmosphere. By this process, about 30 nm thick oxide firm 19 is formed on the surface of the crystalline silicon film 14 left on the substrate 11. By this oxidation process, the crystallinity of the crystalline silicon film 14 can be further improved. Still, this oxidation process may be omitted.

x) Next, as shown in FIG. 1J, the oxide film 19 is removed, and the crystalline silicon film 14 on the substrate 11 is patterned, so that part of the crystalline silicon film 14 is left as an active region 20 for forming TFTs therein.

xi) Next, as shown in FIG. 1K, silicon oxide film 21 is deposited to a thickness of 80 nm all over the entire substrate 11 by CVD process or the like, and subsequently, a gate electrode 22 is formed on the active region 20 with the silicon oxide film 21 interposed therebetween. Further, with the gate electrode 22 used as a mask, phosphorus ions are implanted to a dose of about $3 \times 10^{15}$ cm$^{-2}$ through the silicon oxide film 21, so that a source region 23 and a drain region 24 are formed at portions of the active region 20 corresponding to both sides of the gate electrode 22. A region of the active region 20 defined between the source region 23 and the drain region 24 becomes a channel region 25 of a TFT.

xii) Next, as shown in FIG. 1L, an interlayer insulator 26 is formed all over the substrate 11 by CVD process or the like. Subsequently, a heat treatment at a temperature of 900° C. for 30 min. is performed in order to activate the phosphorus ions implanted into the source region 23 and the drain region 24. Next, a source contact hole 27 and a drain contact hole 28 are formed in the interlayer insulator 26 so as to range from its surface to the source region 23 and the drain region 24. Thereafter, electrode material is deposited all over the substrate 11, and this electrode material is patterned, by which a source electrode 29 and a drain electrode 30 in contact with the source region 23 and the drain region 24, respectively, are formed.

xiii) Finally, as shown in FIG. 1M, silicon nitride film 31 is deposited as a protective film all over the substrate 11, and a hydrogenated process is performed thereon.

In this way, TFTs having excellent electrical characteristics and reliability are obtained.

Although the Ni element 13 has been used as a catalyst for accelerating the crystallization of the α-Si film 12 in this embodiment, the catalyst is not limited to this, of course. As the catalytic elements, one kind of element or a plurality of kinds of elements selected from among Fe, Co, Ni, Cu, Ru, Rh, Pd, Os, Ir, Pt and Au may be used. As a result of this, actually, a high-quality crystalline silicon film can be obtained.

Further, as the getter element, one kind of element or a plurality of kinds of elements selected from among nitrogen, phosphorus, arsenic, antimony and bismuth may be used. These elements, having a property of bonding with metallic elements, allow the metallic element to be gettered with high efficiency, so that the metallic-element concentration in the gettered regions of the crystalline silicon film can be reduced sufficiently.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor manufacturing method comprising:
   forming an amorphous silicon film on a substrate;
   introducing a catalytic element into the amorphous silicon film for accelerating crystallization and performing a first heat treatment to crystallize the amorphous silicon film into a crystalline silicon film;
   forming a mask layer having an opening defined therein on a surface of the crystalline silicon film;
   forming a sacrifice layer which at least partially covers an outer surface of the mask layer, and which also covers a portion of the crystalline silicon film at an area of the opening in the mask layer;
   introducing a getter element into the sacrifice layer and the portion of the crystalline silicon film at the area of the opening for gettering the catalytic element; and
   performing a second heat treatment to getter the catalytic element from the crystalline silicon film to the sacrifice layer through the opening defined in the mask layer.

2. The semiconductor manufacturing method according to claim 1, wherein the mask layer comprises at least one of silicon oxide, silicon nitride and SiON.

3. The semiconductor manufacturing method according to claim 1, wherein material of the sacrifice layer comprises any one of amorphous silicon, polysilicon and single crystal silicon.

4. The semiconductor manufacturing method according to claim 1, wherein
   temperature of the second heat treatment is set to within a range of 500° C. to 700° C.

5. The semiconductor manufacturing method according to claim 1, wherein
   one kind of element or a plurality of kinds of elements selected from among Fe, Co, Ni, Cu, Ru, Rh, Pd, Os, Ir, Pt and Au is used as the catalytic element.

6. The semiconductor manufacturing method according to claim 1, wherein
   one kind of element or a plurality of kinds of elements selected from among nitrogen, phosphorus, arsenic, antimony and bismuth is used as the getter element.

7. A semiconductor manufacturing method comprising:
   forming a layer comprising amorphous silicon on a substrate;
   introducing a catalytic element into the layer comprising amorphous silicon for accelerating crystallization and performing a first heat treatment to crystallize the layer comprising amorphous silicon into a layer comprising crystalline silicon;
   after said first heat treatment and after the layer comprising amorphous silicon has been crystallized into the layer comprising crystalline silicon, forming a mask layer having an opening defined therein on the substrate over and in direct contact with a surface of the layer comprising crystalline silicon;
   forming a sacrificial layer on the substrate which at least partially covers an outer surface of the mask layer, and which covers a portion of the layer comprising crystalline silicon at an area of the opening defined in the mask layer, so that the sacrificial layer is at least partially provided in the opening defined in the mask;
   introducing a getter element into the sacrificial layer and the portion of the layer comprising crystalline silicon for gettering the catalytic element;
   performing a second heat treatment to getter the catalytic element from the layer comprising crystalline silicon to the sacrificial layer through the opening defined in the mask layer; and
   removing the sacrificial layer and the mask.

8. The method of claim 7, wherein the catalytic element comprises at least one of Fe, Go, Ni, Cu, Ru, Rh, Pd, Os, Ir, Pt and Au.

9. The method of claim 7, wherein the getter element comprises at least one of nitrogen, phosphorus, arsenic, antimony and bismuth.

10. The method of claim 7, wherein a temperature of the second heat treatment is set to within a range of 500° C. to 700° C.

* * * * *